US008125244B2

United States Patent
Baddela et al.

(10) Patent No.: US 8,125,244 B2
(45) Date of Patent: Feb. 28, 2012

(54) LOW VOLTAGE ELECTRONIC MODULE INTERFACE

(75) Inventors: Srinivasa Baddela, Streamwood, IL (US); Aly Aboulnaga, Des Plaines, IL (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 232 days.

(21) Appl. No.: 12/377,608

(22) PCT Filed: Aug. 15, 2007

(86) PCT No.: PCT/IB2007/053255
§ 371 (c)(1),
(2), (4) Date: Feb. 16, 2009

(87) PCT Pub. No.: WO2008/020408
PCT Pub. Date: Feb. 21, 2008

(65) Prior Publication Data
US 2010/0231257 A1  Sep. 16, 2010

Related U.S. Application Data

(60) Provisional application No. 60/822,426, filed on Aug. 15, 2006.

(51) Int. Cl.
*H03K 17/16* (2006.01)
*H03K 19/0175* (2006.01)
(52) U.S. Cl. .......................................... 326/62; 326/33
(58) Field of Classification Search ............... 326/82–87
See application file for complete search history.

(56) References Cited

U.S. PATENT DOCUMENTS

| 3,950,741 | A | 4/1976 | Schroeder |
| 5,363,332 | A | 11/1994 | Murabayashi et al. |
| 5,675,268 | A | 10/1997 | Petty et al. |
| 5,909,348 | A | 6/1999 | Zydek et al. |
| 6,349,022 | B1 | 2/2002 | Myong et al. |
| 6,448,784 | B1 | 9/2002 | Belau et al. |
| 6,490,512 | B1 | 12/2002 | Niggemann |
| 6,515,502 | B1 * | 2/2003 | Hsiao et al. ............ 326/30 |

FOREIGN PATENT DOCUMENTS

EP  0641688 A1  3/1995

OTHER PUBLICATIONS

USPTO, Certificate of Correction, Patent No. 6448784B1, p. 1, 2003.

* cited by examiner

*Primary Examiner* — Shawki S Ismail
*Assistant Examiner* — Thienvu Tran

(57) ABSTRACT

A low voltage electronic module interface, with a low voltage interface for an electronic module receiving a constant current from a body control module, the interface including a reverse current protection circuit 152; and a switch 154 operably connected in series with the reverse current protection circuit 152, the switch 154 being responsive to a status signal 144. The reverse current protection circuit 152 and the switch 154 form a low voltage electronic module interface circuit 150 having a resistance; and the resistance is selected so voltage across the low voltage electronic module interface circuit 150 is less than 2.70 Volts when the switch 154 is closed and the constant current 124 flows through the low voltage electronic module interface circuit 150.

18 Claims, 4 Drawing Sheets

LOW VOLTAGE ELECTRONIC MODULE INTERFACE

This invention relates generally to vehicle control systems, and more specifically to a low voltage electronic module interface for a vehicle control system.

Vehicles, such as automobiles, use a body control module (BCM) to monitor and control various electronic modules throughout the vehicle. One example is the monitoring and turning on of the stop/turn lights of a vehicle. When a particular vehicle system is not operational, the electronic module provides an outage signal to the BCM, which provides a trouble indication to the driver.

The electronic modules each include an interface circuit to enable communication and provide protection between the electronic module and the BCM. The electronic modules must be protected from reverse voltage and short-to-battery conditions. Present interface circuits include a diode, resistance, and switch, such as a transistor, connected in series. The BCM provides a constant current to the interface circuit and monitors the voltage across the interface circuit. The switch is open or closed depending on system status and the BCM detects a high or low voltage across the interface circuit. The diode protects the electronic module from reverse voltage and the resistance is sized to limit current in a short-to-battery condition.

Recent design specification changes have caused problems for the present interface circuit. In the present interface circuit, the switch is closed when the system status is OK so that the voltage across the interface circuit is less than the design specification of 2.7 Volts. The design specification has changed, however, to require a much lower voltage, in one case as low as 0.27 Volts. The design specification change provides a more definite indication to the BCM. One proposed solution to meet the new design specification is to reduce the resistor values to decrease the voltage drop. This approach exceeds the power ratings of the resistors and the switch, however. Resistors and switches with higher power ratings could be used, but this would increase costs, and increase the physical size of the components, using valuable space on the circuit board. Such a low voltage also conflicts with the need limit current in a short-to-battery condition: a low resistance is required to provide a low voltage, but a high resistance is required to limit current in case of a short.

It would be desirable to provide a low voltage electronic module interface that overcomes the above disadvantages.

One aspect of the invention provides a low voltage interface for an electronic module receiving a constant current from a body control module, the interface including a reverse current protection circuit; and a switch operably connected in series with the reverse current protection circuit, the switch being responsive to a status signal. The reverse current protection circuit and the switch form a low voltage electronic module interface circuit having a resistance; and the resistance is selected so voltage across the low voltage electronic module interface circuit is less than 2.70 Volts when the switch is closed and the constant current flows through the low voltage electronic module interface circuit.

Another aspect of the invention provides a module interfacing method including providing an electronic module having an outage detection pin, the electronic module having a resistance to a constant current to generate less than 2.70 Volts at the outage detection pin when the constant current flows through the electronic module; providing the constant current from a body control module (BCM) to the outage detection pin; switching the constant current through the electronic module in response to a status signal; and determining voltage at the outage detection pin.

Another aspect of the invention provides module interfacing system including an electronic module having an outage detection pin, the electronic module having a resistance to a constant current to generate less than 2.70 Volts at the outage detection pin when the constant current flows through the electronic module; means for providing the constant current from a body control module (BCM) to the outage detection pin; means for switching the constant current through the electronic module in response to a status signal; and means for determining voltage at the outage detection pin.

The foregoing and other features and advantages of the invention will become further apparent from the following detailed description of the presently preferred embodiment, read in conjunction with the accompanying drawings. The detailed description and drawings are merely illustrative of the invention rather than limiting, the scope of the invention being defined by the appended claims and equivalents thereof.

FIG. 1 is a block diagram of a vehicle control system with a low voltage electronic module interface made in accordance with the present invention. The low voltage electronic module interface provides a low voltage from an electronic module, assuring a valid indication of electronic module status at the body control module (BCM).

Figure 1:
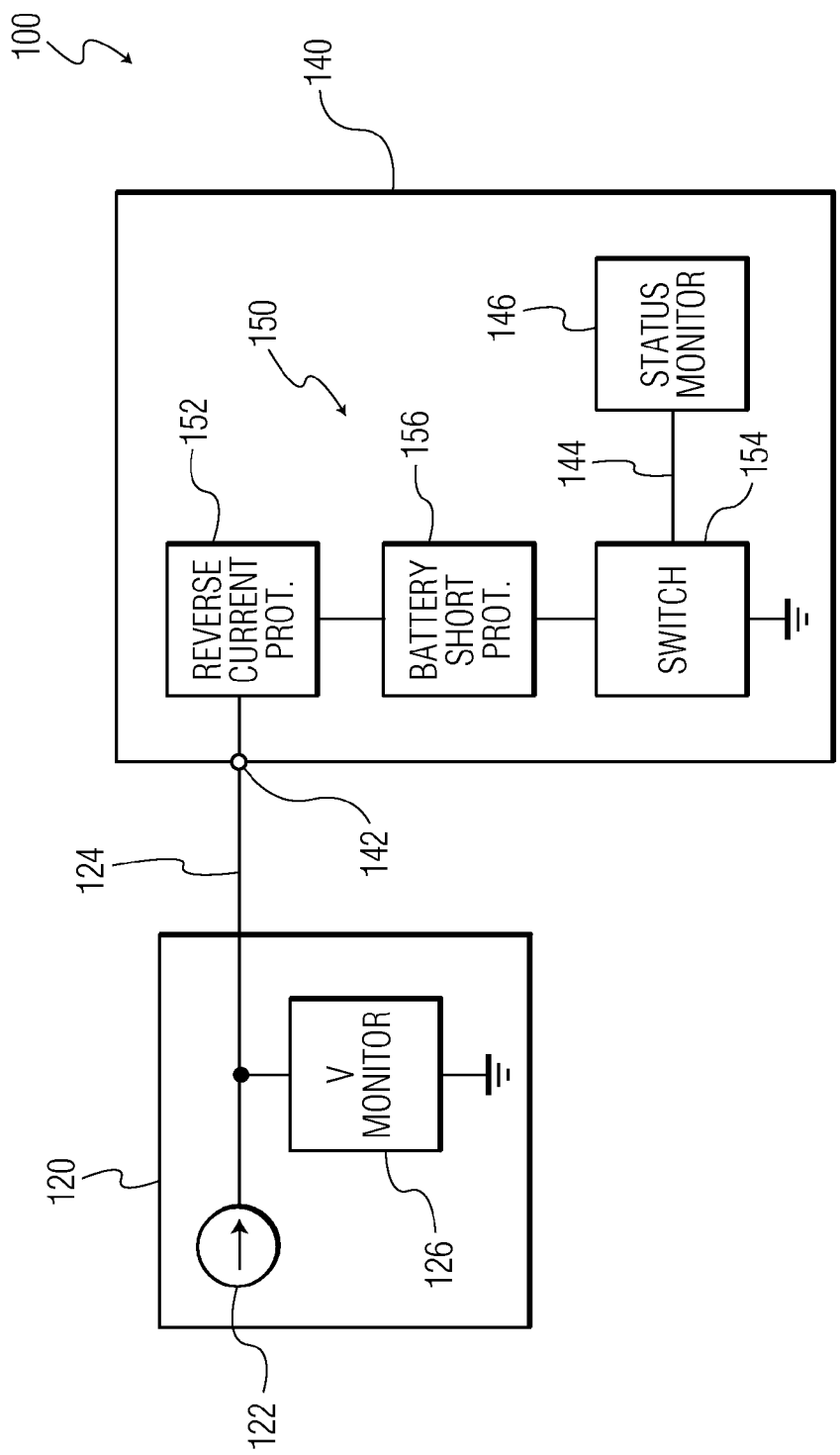
FIG. 1 is a block diagram of a vehicle control system with a low voltage electronic module interface made in accordance with the present invention.

The vehicle control system 100 includes a body control module (BCM) 120 operably connected to one or more electronic modules 140. The BCM 120 includes a constant current source 122 providing a constant current 124 to the electronic module 140. The BCM 120 also includes a voltage monitor 126 which monitors the voltage of the constant current 124. The voltage monitor 126 can be any suitable voltage monitor, such as a voltage monitoring circuit, microprocessor based circuit, analog based circuit, or the like. The electronic module 140 receives the constant current 124 from the BCM 120 at an outage detection pin 142. The electronic module 140 includes a low voltage electronic module interface circuit 150 responsive to a status signal 144 from a status monitor 146. The low voltage electronic module interface circuit 150 has a resistance and includes a reverse current protection circuit 152 and a switch 154 operably connected in series. The resistance is selected so voltage across the low voltage electronic module interface circuit 150 is less than 2.70 Volts when the switch 154 is closed and the constant current 124 flows through the low voltage electronic module interface circuit 150. In one embodiment, the low voltage electronic module interface circuit 150 also includes an optional battery short protection circuit 156. Those skilled in the art will appreciate that the reverse current protection circuit 152, battery short protection circuit 156, and switch 154 can share components as desired for a particular application. In another embodiment, the low voltage electronic module interface circuit 150 also includes an optional filter (not shown).

In operation, the status monitor 146 monitors the electronic module condition and generates the status signal 144. As used herein, the electronic module condition is defined to include the condition of the electronic module 140 itself and/or the condition of components attached to the electronic module 140, such as light bulbs, turning lamps, LEDs, open doors, open seat belts, or the like. When the monitored electronic module condition is normal, the status signal 144 is normal. In one embodiment, the status signal 144 is high when the electronic module condition is normal and low when the electronic module condition is not normal. The switch 154 is responsive to the status signal 144 to switch the constant current 124 flowing through the low voltage electronic module interface circuit 150. The voltage monitor 126 of the BCM 120 determines the voltage at the outage detection pin 142 of the electronic module 140. When the switch 154 is closed, the voltage monitor 126 detects a low voltage at the BCM 120. When the switch 154 is open, the voltage monitor 126 detects a high voltage at the BCM 120. As used herein, a low voltage is defined as less than 2.70 Volts. The resistance of the low voltage electronic module interface circuit 150 is selected so voltage across the low voltage electronic module interface circuit 150 is less than 2.70 Volts when the switch 154 is closed and the constant current 124 flows through the low voltage electronic module interface circuit 150. In one example, the constant current 124 is 18 mAmps and the resistance of the low voltage electronic module interface circuit 150 is 50 Ohms. This produces a voltage of 0.9 Volts at the outage detection pin 142. In another example, the constant current 124 is 18 mAmps and the resistance of the low voltage electronic module interface circuit 150 is 7.5 Ohms. This produces a voltage of about 0.14 Volts at the outage detection pin 142. Those skilled in the art will appreciate that the resistance of the low voltage electronic module interface circuit 150 can be selected to provide the desired voltage, such as a voltage less than 2.7, 1.0, or 0.25 Volts, across the low voltage electronic module interface circuit 150.

The reverse current protection circuit 152 and the battery short protection circuit 156 protect the vehicle control system 100 from particular faults. The reverse current protection circuit 152 limits reverse current from common through the low voltage electronic module interface circuit 150 toward the outage detection pin 142. Such a fault can occur when the polarity of the battery terminals is reversed. The optional battery short protection circuit 156 limits battery short current through the low voltage electronic module interface circuit 150. Such a fault can occur when the outage detection pin 142 or other power supply point is shorted to the battery positive.

Figure 2:
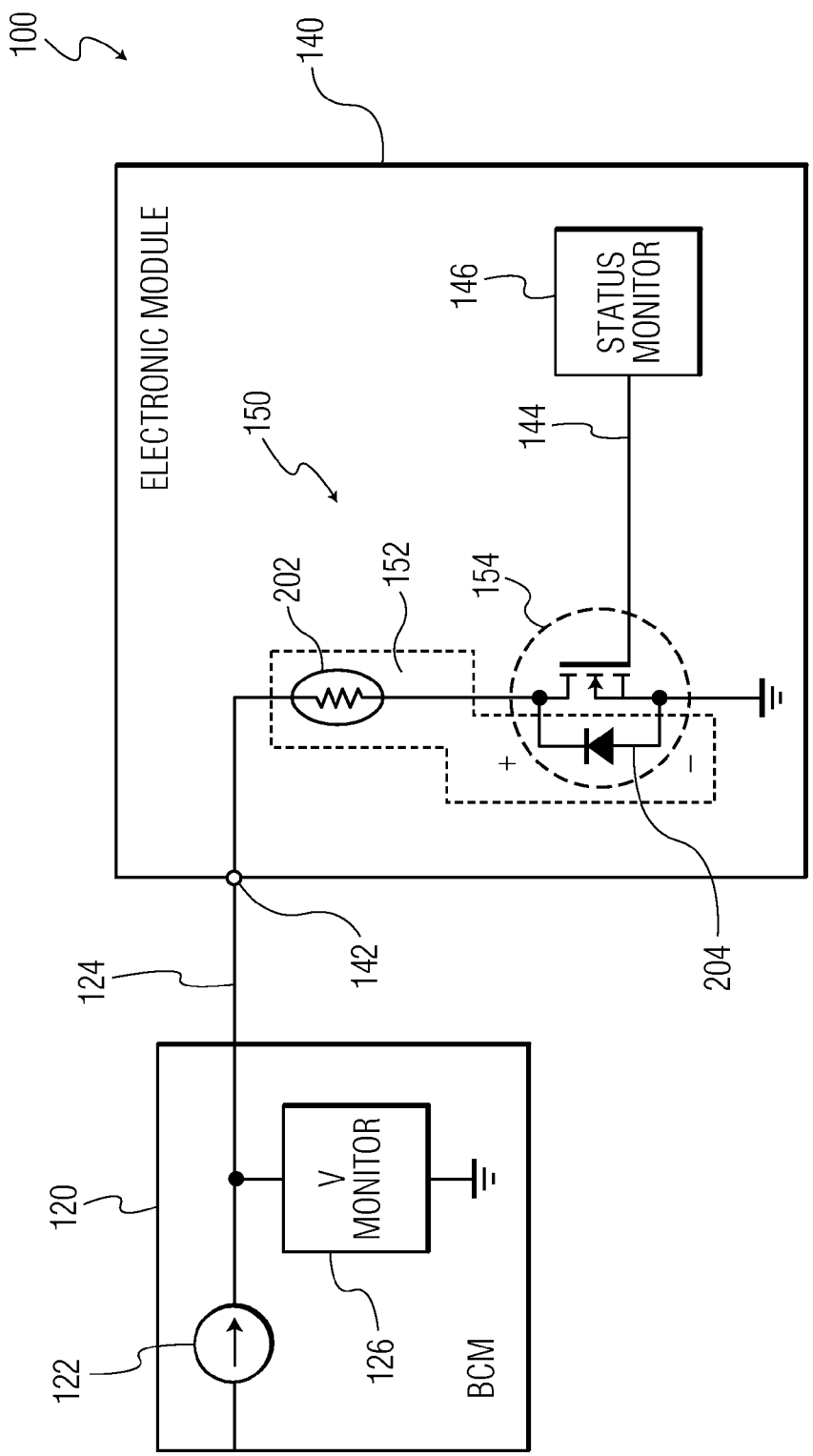
FIG. 2 is a schematic diagram of one embodiment of a low voltage electronic module interface made in accordance with the present invention.

FIG. 2, in which like elements share like reference numbers with FIG. 1, is a schematic diagram of one embodiment of a low voltage electronic module interface made in accordance with the present invention. The low voltage electronic module interface circuit provides a low voltage at the outage detection pin when the constant current flows through the low voltage electronic module interface circuit and protects the vehicle control system 100 from reverse currents and battery shorts.

The low voltage electronic module interface circuit 150 has a switch 154, which is an FET switch, and a reverse current protection circuit 152, which includes an overcurrent protector 202 and a internal body diode 204 of the switch 154. In one embodiment, the overcurrent protector 202 is a resettable positive temperature coefficient (PTC) device. In another embodiment, the overcurrent protector 202 is a fuse. In one embodiment, the internal body diode 204 of the switch 154 is omitted and a diode external to the FET switch used in the reverse current protection circuit 152. The overcurrent protector 202 also acts as a battery short protection circuit.

In operation, the switch 154 is responsive to the status signal 144 from the status monitor 146 to switch the voltage at the outage detection pin 142. In one example with the overcurrent protector 202 as a resettable PTC device, the constant current 124 is 18 mAmps and the resistance of the low voltage electronic module interface circuit 150 is 7.5 Ohms (6 Ohms from the resettable PTC device plus 1.5 Ohms from the FET switch). This produces a voltage of about 0.14 Volts at the outage detection pin 142.

The reverse current protection circuit 152 includes the overcurrent protector 202 and the internal body diode 204 of the switch 154. When the potential of the outage detection pin 142 is lower than ground, current flows through the internal body diode 204 of the switch 154 and through the overcurrent protector 202. The overcurrent protector 202 limits reverse current when the reverse current exceeds the rating of the overcurrent protector 202. When the overcurrent protector 202 is a resettable PTC device, the overcurrent protector 202 provides a high resistance and limits the reverse current. After the resettable PTC device cools down the resistance returns to a low resistance and the electronic module 140 is ready for continued use. When the overcurrent protector 202 is a fuse, the overcurrent protector 202 opens and limits the reverse current. The fuse must then be replaced before the electronic module 140 can be used.

The overcurrent protector 202 acts as a battery short protection circuit. When the current through the low voltage electronic module interface circuit 150 from the outage detection pin 142 to ground exceeds the rating of the overcurrent protector 202, the overcurrent protector 202 limits the current. When the overcurrent protector 202 is a resettable PTC device, the overcurrent protector 202 provides a high resistance and limits the current. After the resettable PTC device cools down the resistance returns to a low resistance and the electronic module 140 is ready for continued use. When the overcurrent protector 202 is a fuse, the overcurrent protector 202 opens and limits the current. The fuse must then be replaced before the electronic module 140 can be used.

Figure 3:
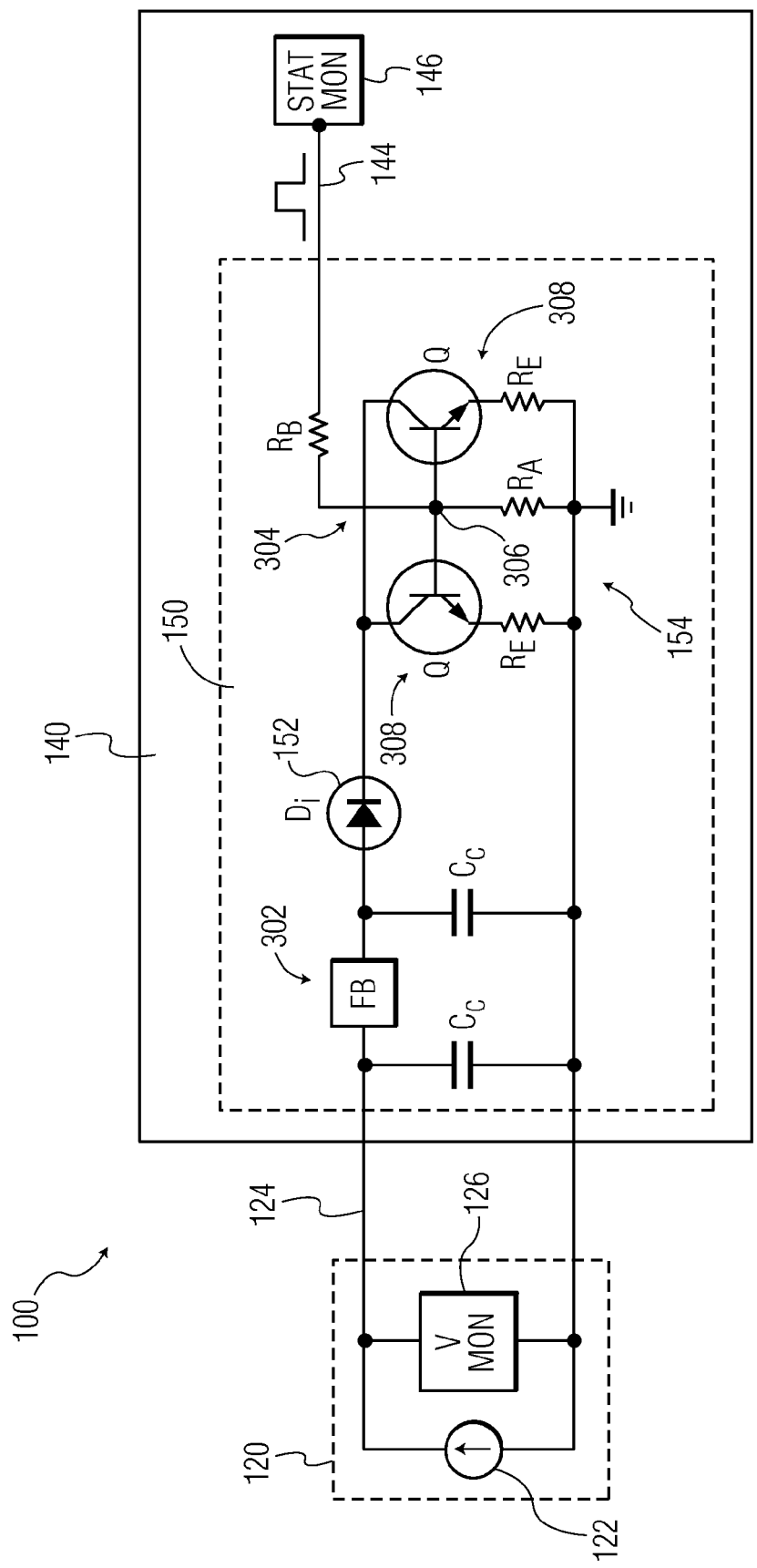
FIGS. 3 & 4 are schematic diagrams of another embodiment of a low voltage electronic module interface made in accordance with the present invention.
Figure 4:
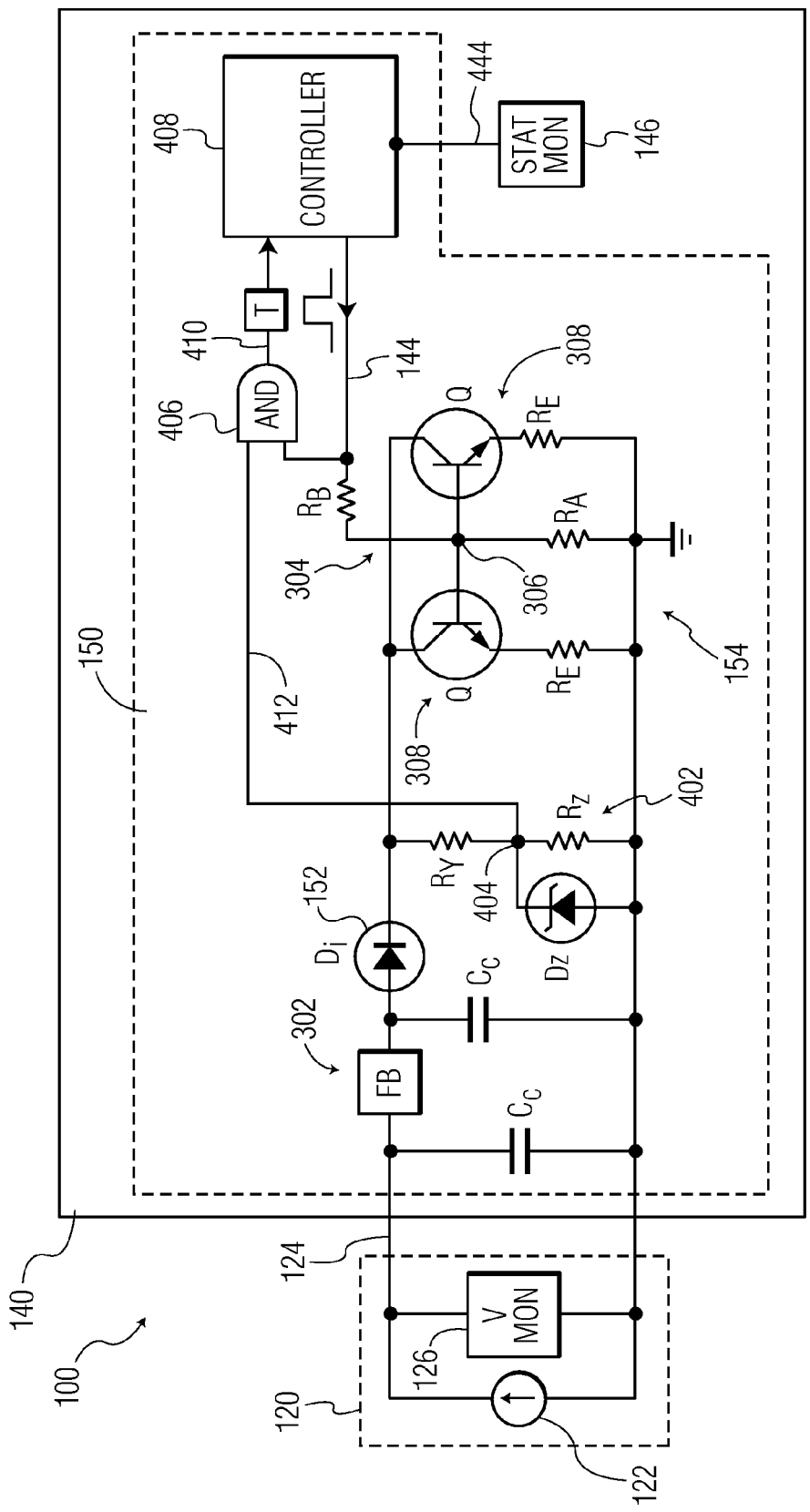

FIGS. 3 & 4, in which like elements share like reference numbers with FIG. 1 and with each other, are schematic diagrams of another embodiment of a low voltage electronic module interface made in accordance with the present invention. FIG. 3 is a schematic diagram of a low voltage electronic module interface circuit which provides a low voltage at the outage detection pin when the constant current flows through the low voltage electronic module interface circuit and protects the vehicle control system 100 from reverse currents. FIG. 4 is a schematic diagram of a low voltage electronic module interface circuit similar to the low voltage electronic module interface circuit of FIG. 3 which also protects the vehicle control system 100 from battery shorts.

Referring to FIG. 3, the low voltage electronic module interface circuit 150 has a reverse current protection circuit 152 and a switch 154. In one embodiment, the reverse current protection circuit 152 is a diode operably connected in series between the outage detection pin 142 and the switch 154. The switch 154 includes a switch voltage divider 304 with resistors $R_B$ and $R_A$ connected at a switch voltage divider midpoint 306, and a pair of transistor series circuits 308 with transistor Q and resistor $R_E$ connected in series. The switch voltage divider 304 receives status signal 144 from status monitor 146. The pair of transistor series circuits 308 is operably connected as a mirror pair between the outage detection pin 142 and ground through the reverse current protection circuit 152. The base of each transistor Q is connected to the switch voltage divider midpoint 306 of the switch voltage divider 304.

The exemplary low voltage electronic module interface circuit 150 also has an optional filter 302. The filter 302 includes two capacitors $C_c$ connected parallel to the pair of transistor series circuits 308 between the outage detection pin 142 and ground, and a ferrite bead inductor operably connected between the two capacitors $C_c$ in series with the switch 154. The filter 302 filters the high frequency noise between the electronic module 140 and the BCM 120.

In operation, the switch 154 is responsive to the status signal 144 from the status monitor 146 to switch the voltage at the outage detection pin 142. In one example, the values of the resistors $R_B$ and $R_A$ of the voltage divider are 3.6 kOhms and 2.4 kOhms, respectively. The values of the resistors $R_E$ in the transistor series circuits are each 100 Ohms, so the parallel resistance is 50 Ohms. The constant current 124 is 18 mAmps and the of the low voltage electronic module interface circuit 150 is about the 50 Ohms of the parallel transistor series circuits, so the voltage is about 0.9 Volts at the outage detection pin 142.

Those skilled in the art will appreciate that the switch 154, which acts as a detection circuit, is not limited to the exemplary mirror pair arrangement. In one embodiment, the switch 154 uses a single transistor series circuit. In another embodiment, the switch 154 uses three or more transistor series circuits with the bases connected. The switch 154 with multiple transistors, i.e., two or more, can compensate for variations in components and temperature to assure a consistent current through the low voltage electronic module interface circuit 150.

The reverse current protection circuit 152 includes the diode operably connected in series between the outage detection pin 142 and the switch 154. When the potential of the outage detection pin 142 is lower than ground, the diode blocks reverse current flow.

Referring to FIG. 4, the low voltage electronic module interface circuit 150 has a battery short protection circuit 156. The battery short protection circuit 156 includes a battery short voltage divider of resistors $R_y$ and $R_z$ operably connected between the outage detection pin 142 and ground through the reverse current protection circuit 152. A battery short midpoint 404 of the battery short voltage divider 402 is connected to ground through a Zener diode $D_z$. The battery short midpoint 404 is also connected to one input of a logic gate 406, such as an AND gate, and receives a short signal 412. The other input of the logic gate 406 is connected to the switch voltage divider 304 of the switch 154 and receives a status signal 144 from a controller 408. The output of the logic gate 406 is provided to the controller 408 as a shutdown signal 410 through an optional time delay τ. The controller 408 also receives the preliminary status signal 444 from status monitor 146 and provides the status signal 144 to the switch 154.

In normal operation, the voltage at the battery short midpoint 404 provides a low short signal 412 at one input of the logic gate 406 and the other input to the logic gate 406 from the status signal 144 is high. Thus, the shutdown signal 410 from the logic gate 406 is normally low. When the battery is shorted to the outage detection pin 142, battery voltage is present across the battery short voltage divider 402 of resistors $R_y$ and $R_z$. The Zener diode $D_z$ is operably connected between the battery short midpoint 404 of the battery short voltage divider 402 and ground to assure that the battery short condition does not exceed the input voltage rating of the logic gate 406. In one embodiment, the values of the resistors $R_y$ and $R_z$ are 50 kOhms and 15 kOhms, respectively, and the Zener diode $D_z$ is a 3.9 Volt Zener diode. The voltage at the battery short midpoint 404 provides a high short signal 412 in a shutdown signal shutdown state at one input to the logic gate 406. The other input to the logic gate 406 from the status signal 144 is also high when the preliminary status signal 444 is normal, so the shutdown signal 410 from the logic gate 406 is high. The controller 408 can recognize the high shutdown signal 410 as a battery short condition and set the status signal 144 to low as a status signal shutdown state, shutting off the switch 154 and protecting the electronic module 140. When the battery short clears, the controller 408 can set the status signal 144 to high to restore the electronic module 140 to operation. In one embodiment, the shutdown signal 410 can be processed through the optional time delay τ to delay shutting down the electronic module 140 when the short signal 412 goes high. The optional time delay τ can avoid shutdown due to spurious signals and/or noise. In one embodiment, the logic gate 406 and the optional time delay τ can be implemented as functions within the controller 408. In another embodiment, the controller 408 and the optional time delay τ can be fabricated using RC circuit or semiconductor based components and logic gates. Those skilled in the art will appreciate that the logic gate 406 can be any logic gate and/or combination of logic gates providing the desired logic for a particular application.

While the embodiments of the invention disclosed herein are presently considered to be preferred, various changes and modifications can be made without departing from the scope of the invention. Those skilled in the art will appreciate that the embodiments described are exemplary and that alternative circuits can be used as desired for particular applications. The scope of the invention is indicated in the appended claims, and all changes that come within the meaning and range of equivalents are intended to be embraced therein.

The invention claimed is:

1. A low voltage interface for an electronic module receiving a constant current from a body control module, the interface comprising:
   a reverse current protection circuit; and
   a switch operably connected in series with the reverse current protection circuit, the switch being responsive to a status signal;
   wherein the reverse current protection circuit and the switch form a low voltage electronic module interface circuit having a resistance; and the resistance is selected so voltage across the low voltage electronic module interface circuit is less than 2.70 Volts when the switch is closed and the constant current flows through the low voltage electronic module interface circuit;
   wherein the reverse current protection circuit comprises an overcurrent protector in series with a diode, the diode being operably connected parallel to the switch.

2. The circuit of claim 1 wherein the resistance is selected so voltage across the low voltage electronic module interface circuit is less than 1.0 Volt when the switch is closed and the constant current flows through the low voltage electronic module interface circuit.

3. The circuit of claim 1 wherein the resistance is selected so voltage across the low voltage electronic module interface circuit is less than 0.25 Volts when the switch is closed and the constant current flows through the low voltage electronic module interface circuit.

4. The circuit of claim 1 further comprising a battery short protection circuit operably connected in series with the switch.

5. The circuit of claim 1 further comprising a filter operably connected to the switch.

6. The circuit of claim 1 wherein the overcurrent protector is a resettable positive temperature coefficient (PTC) device.

7. The circuit of claim 1 wherein the overcurrent protector is a fuse.

8. The circuit of claim 1 wherein the switch is an FET switch and the diode is an internal body diode of the switch.

9. The circuit of claim 1 wherein the switch is an FET switch.

10. A low voltage interface for an electronic module receiving a constant current from a body control module, the interface comprising:
- a reverse current protection circuit;
- a switch operably connected in series with the reverse current protection circuit, the switch being responsive to a status signal; and
- a battery short protection circuit operably connected in series with the switch, the battery short protection circuit having an overcurrent protector selected from the group consisting of a resettable positive temperature coefficient (PTC) device and a fuse;
- wherein the reverse current protection circuit and the switch form a low voltage electronic module interface circuit having a resistance, the resistance is selected so voltage across the low voltage electronic module interface circuit is less than 2.70 Volts when the switch is closed and the constant current flows through the low voltage electronic module interface circuit.

11. The circuit of claim 1 wherein the reverse current protection circuit is a diode.

12. The circuit of claim 1 wherein the switch is at least one transistor series circuit having a transistor and resistor operably connected in series.

13. A low voltage interface for an electronic module receiving a constant current from a body control module, the interface comprising:
- a reverse current protection circuit; and
- a switch operably connected in series with the reverse current protection circuit, the switch being responsive to a status signal;
- wherein the reverse current protection circuit and the switch form a low voltage electronic module interface circuit having a resistance, the resistance is selected so voltage across the low voltage electronic module interface circuit is less than 2.70 Volts when the switch is closed and the constant current flows through the low voltage electronic module interface circuit; and
- wherein the switch is at least one transistor series circuit having a transistor and resistor operably connected in series and the at least one transistor series circuit comprises a first series circuit and a second series circuit operably connected as a mirror pair.

14. A low voltage interface for an electronic module receiving a constant current from a body control module, the interface comprising:
- a reverse current protection circuit; and
- a switch operably connected in series with the reverse current protection circuit, the switch being responsive to a status signal;
- wherein the reverse current protection circuit and the switch form a low voltage electronic module interface circuit having a resistance, the resistance is selected so voltage across the low voltage electronic module interface circuit is less than 2.70 Volts when the switch is closed and the constant current flows through the low voltage electronic module interface circuit and wherein the switch is at least one transistor series circuit having a transistor and resistor operably connected in series; and,
- said interface further comprising:
- a battery short protection circuit, the battery short protection circuit comprising:
- a voltage divider operably connected in parallel to the at least one transistor series circuit, the voltage divider having a midpoint providing a short signal;
- a logic gate operable to compare the short signal and the status signal and to generate a shutdown signal; and
- a controller responsive to the shutdown signal and a preliminary status signal to generate the status signal;
- wherein the logic gate sets the shutdown signal to a shutdown signal shutdown state when the short signal indicates a battery short and the status signal indicates normal; and
- the controller sets the status signal to a status signal shutdown state when the shutdown signal is in the shutdown signal shutdown state.

15. The circuit of claim 14 further comprising a Zener diode operably connected between the midpoint and ground.

16. The circuit of claim 14 further comprising a time delay operably connected to delay the shutdown signal.

17. A low voltage interface for an electronic module receiving a constant current from a body control module, the interface comprising:
- a reverse current protection circuit; and
- a switch operably connected in series with the reverse current protection circuit, the switch being responsive to a status signal;
- wherein the reverse current protection circuit and the switch form a low voltage electronic module interface circuit having a resistance, the resistance is selected so voltage across the low voltage electronic module interface circuit is less than 2.70 Volts when the switch is closed and the constant current flows through the low voltage electronic module interface circuit and wherein the switch is at least one transistor series circuit having a transistor and resistor operably connected in series; and,
- said interface further comprising:
- a filter, the filter comprising:
- a first capacitor operably connected in parallel to the at least one transistor series circuit;
- a second capacitor operably connected in parallel to the first capacitor; and
- an inductor operably connected between the first capacitor and the second capacitor, the inductor being operably connected in series with the switch.

18. The circuit of claim 17 wherein the inductor is a ferrite bead inductor.

* * * * *